(12) United States Patent  
Sato

(10) Patent No.: US 8,994,168 B2  
(45) Date of Patent: Mar. 31, 2015

(54) SEMICONDUCTOR PACKAGE INCLUDING RADIATION PLATE

(71) Applicant: Shinko Electric Industries Co., Ltd., Nagano (JP)

(72) Inventor: Yukio Sato, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 52 days.

(21) Appl. No.: 13/894,565

(22) Filed: May 15, 2013

(65) Prior Publication Data

US 2013/0313697 A1    Nov. 28, 2013

(30) Foreign Application Priority Data

May 28, 2012  (JP) ................................. 2012-121193

(51) Int. Cl.  
*H01L 23/34*        (2006.01)  
*H01L 23/367*       (2006.01)  
(Continued)

(52) U.S. Cl.  
CPC ....... *H01L 23/34* (2013.01); *H01L 2224/16225* (2013.01); *H01L 2224/32225* (2013.01); *H01L 2224/48091* (2013.01); *H01L 2224/48227* (2013.01); *H01L 2224/73265* (2013.01); *H01L 2924/15311* (2013.01); *H01L 2924/1815* (2013.01); *H01L 2224/45144* (2013.01); *H01L 2224/45147* (2013.01); *H01L 23/3677* (2013.01); *H01L 23/4334* (2013.01); *H01L 23/49816* (2013.01)  
USPC ........... 257/713; 257/774; 257/778; 257/712; 257/717; 257/720; 257/714; 257/716; 257/675; 257/737; 257/738; 257/707; 257/703; 257/704; 257/690

(58) Field of Classification Search  
CPC .......... H01L 2224/48091; H01L 2224/45144; H01L 2924/15311; H01L 2224/45147; H01L 2924/00014; H01L 2224/32225; H01L 2924/00; H01L 2224/73265; H01L 2224/48227  
USPC ......... 257/774, 778, 713, 712, 717, 720, 714, 257/716, 675, 737, 738, 707, 703, 704  
See application file for complete search history.

(56) References Cited

U.S. PATENT DOCUMENTS 4,794,981 A * 1/1989 Mizuno .................... 165/80.4  
6,489,668 B1 * 12/2002 Oda et al. .................. 257/675  
(Continued)

FOREIGN PATENT DOCUMENTS

| JP | 08-097336 | 4/1996 |
| JP | 2000-223627 | 8/2000 |
| JP | 2012-015225 | 1/2012 |

*Primary Examiner* — Alexander Oscar Williams  
(74) *Attorney, Agent, or Firm* — IPUSA, PLLC

(57) ABSTRACT

A semiconductor package includes a wiring board; a semiconductor chip mounted on the wiring board; and a radiation plate mounted on the semiconductor chip, including an insulating member including a resin that is the same as a resin included in the wiring board, as a main constituent, a first metal foil formed on a first surface of the insulating member, a second metal foil formed on a second surface of the insulating member, the second surface being an opposite to the first surface, the radiation plate being provided with a through hole that penetrates the first metal foil, the insulating member and the second metal foil, and a metal layer formed to cover the inner surface of the through hole to thermally connect the first metal foil and the second metal foil by penetrating the insulating member in a thickness direction.

7 Claims, 7 Drawing Sheets

(51) Int. Cl.
   *H01L 23/433*   (2006.01)
   *H01L 23/498*   (2006.01)

(56) References Cited

U.S. PATENT DOCUMENTS

| | | | | |
|---|---|---|---|---|
| 8,198,541 | B2* | 6/2012 | Sasaoka et al. | 174/252 |
| 8,334,591 | B2* | 12/2012 | Kusano | 257/706 |
| 8,569,892 | B2* | 10/2013 | Mori et al. | 257/774 |
| 2004/0099944 | A1* | 5/2004 | Kimura | 257/706 |
| 2004/0166609 | A1* | 8/2004 | Murayama et al. | 438/122 |
| 2004/0262746 | A1* | 12/2004 | Jung | 257/713 |
| 2007/0096292 | A1* | 5/2007 | Machida | 257/700 |
| 2008/0079146 | A1* | 4/2008 | Hattori et al. | 257/707 |
| 2009/0057903 | A1* | 3/2009 | Okayama et al. | 257/741 |
| 2009/0211798 | A1* | 8/2009 | Horiuchi et al. | 174/262 |
| 2010/0044845 | A1* | 2/2010 | Funaya et al. | 257/685 |
| 2010/0096747 | A1* | 4/2010 | Kusano | 257/706 |
| 2011/0101349 | A1* | 5/2011 | Oda | 257/48 |
| 2011/0175213 | A1* | 7/2011 | Mori et al. | 257/675 |
| 2012/0001315 | A1 | 1/2012 | Mochizuki et al. | |
| 2012/0138337 | A1* | 6/2012 | Kim | 174/250 |
| 2012/0230001 | A1* | 9/2012 | Takahashi et al. | 361/808 |
| 2013/0081796 | A1* | 4/2013 | Horiuchi et al. | 165/185 |
| 2013/0126916 | A1* | 5/2013 | Arai et al. | 257/88 |
| 2014/0024177 | A1* | 1/2014 | Mori et al. | 438/123 |

* cited by examiner

SEMICONDUCTOR PACKAGE INCLUDING RADIATION PLATE

CROSS-REFERENCE TO RELATED APPLICATION

The present application is based on and claims the benefit of priority of Japanese Priority Application No. 2012-121193 filed on May 28, 2012, the entire contents of which are hereby incorporated by reference.

BACKGROUND OF THE INVENTION

1. Field of the Invention

The present invention relates to a semiconductor package including a radiation plate.

2. Description of the Related Art

A semiconductor package is known, for example, in which a semiconductor chip used in a Central Processing Unit (CPU) or the like, is mounted on a wiring board. Such a semiconductor chip reaches a high temperature when being operated so that it is necessary to improve heat radiation characteristics of the semiconductor package in order to lower the temperature of the semiconductor chip. Without such a configuration, there may be a possibility that the semiconductor chip is damaged in addition to the fact that the semiconductor chip cannot maintain performance.

In order to improve heat radiation characteristics, a semiconductor package has been suggested in which a radiation plate is attached to a semiconductor chip and the semiconductor chip is sealed by a resin layer such that the radiation plate is exposed. A material for the radiation plate may be, for example, a ceramic such as silicon, alumina or the like, or a metal such as copper (Cu) or the like.

However, although the ceramic such as silicon, alumina or the like, or the metal such as copper (Cu) has good heat radiation characteristics, its adhesion property with a resin material that composes the resin layer is poor. Thus, there has been a problem wherein a cracking or chipping is generated between the radiation plate and the resin layer when an external shock or the like is applied to the semiconductor package.

PATENT DOCUMENT

[Patent Document 1] Japanese Laid-open Patent Publication No. 2012-15225

SUMMARY OF THE INVENTION

The present invention is made in light of the above problems, and provides a semiconductor package including a radiation plate having a good adhesion property with a resin layer.

According to an embodiment, there is provided a semiconductor package including a wiring board; a semiconductor chip mounted on the wiring board; and a radiation plate mounted on the semiconductor chip, including an insulating member including a resin that is the same as a resin included in the wiring board, as a main constituent, a first metal foil formed on a first surface of the insulating member, a second metal foil formed on a second surface of the insulating member, the second surface being an opposite to the first surface, the radiation plate being provided with a through hole that penetrates the first metal foil, the insulating member and the second metal foil, and a metal layer formed to cover the inner surface of the through hole to thermally connect the first metal foil and the second metal foil by penetrating the insulating member in a thickness direction.

According to another embodiment, there is provided a radiation plate that is to be attached to a semiconductor chip mounted on a wiring board, including an insulating member including a resin that is the same as a resin included in the wiring board, as a main constituent; a first metal foil formed on a first surface of the insulating member; a second metal foil formed on a second surface of the insulating member, the second surface being an opposite to the first surface, the radiation plate being provided with a through hole that penetrates the first metal foil, the insulating member and the second metal foil; and a metal layer formed to cover the inner surface of the through hole to thermally connect the first metal foil and the second metal foil by penetrating the insulating member in a thickness direction.

According to another embodiment, there is provided a method of manufacturing a radiation plate that is to be attached to a semiconductor chip mounted on a wiring board, the method, including forming a through hole that penetrates a first metal foil, an insulating member and a second metal foil, the first metal foil and the second metal foil being formed on a first surface and a second surface of the insulating member, respectively, the second surface being an opposite to the first surface, the insulating member including a resin that is the same as a resin included in the wiring board, as a main constituent; and forming a metal layer to cover the inner surface of the through hole to thermally connect the first metal foil and the second metal foil via the through hole.

Note that also arbitrary combinations of the above-described elements, and any changes of expressions in the present invention, made among methods, devices and so forth, are valid as embodiments of the present invention.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

Figure 1A:
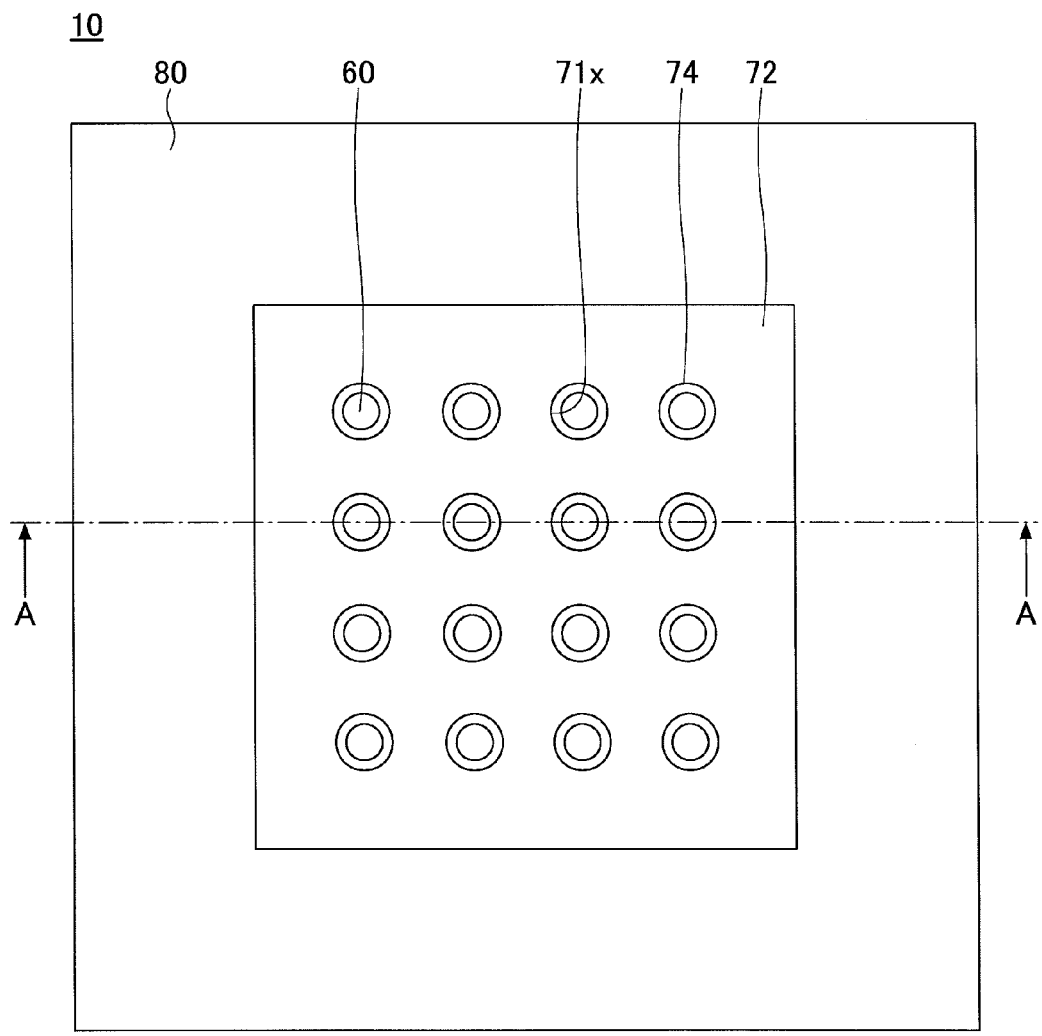
FIG. 1A is a plan view showing an example of a semiconductor package of a first embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

First Embodiment

A structure of a semiconductor package of the first embodiment is explained.

Figure 1B:
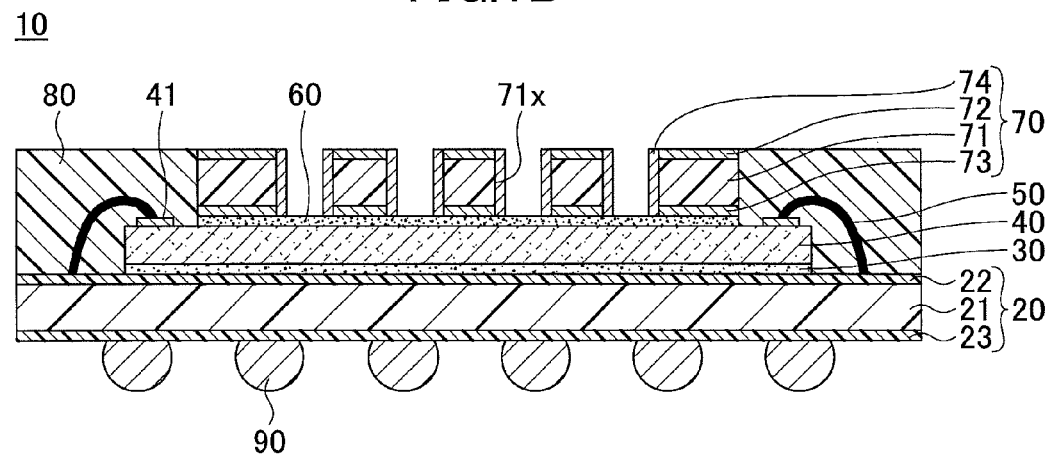
FIG. 1B is a cross-sectional view showing an example of the semiconductor package of the first embodiment taken along an A-A line in FIG. 1A.

FIG. 1A and FIG. 1B show an example of a semiconductor package 10 of the first embodiment. FIG. 1A is a plan view and FIG. 1B is a cross-sectional view taken along an A-A line in FIG. 1A.

With reference to FIG. 1A and FIG. 1B, the semiconductor package 10 of the first embodiment includes a wiring board 20, an adhesion layer 30, a semiconductor chip 40, a plurality of metal wirings 50, an adhesion layer 60, a heat radiation plate 70, a resin layer 80 and a plurality of external connection terminals 90. In the semiconductor package 10, one of the surfaces of each component at a side (upper side in FIG. 1B) where the heat radiation plate 70 is attached may be referred to as a "first surface", while the other of the surfaces of each component at a side (lower side in FIG. 1B) where the external connection terminals 90 are formed may be referred to as a "second surface".

The wiring board 20 includes an insulating member 21 and solder resist layers 22 and 23. For the insulating member 21, for example, a member in which epoxy resin is impregnated in a glass cloth may be used. The thickness of the insulating member 21 may be, for example, about a few hundred micrometers.

The insulating member 21 is provided with a first wiring pattern (not shown in the drawings) and the solder resist layer 22 that selectively covers the first wiring pattern at its first surface. Parts of the first wiring pattern, which are exposed from the solder resist layer 22, form first pads (not shown in the drawings) and are electrically connected to the metal wirings 50, respectively.

The insulating member 21 is provided with a second wiring pattern (not shown in the drawings) and the solder resist layer 23 that selectively covers the second wiring pattern at its second surface. Parts of the second wiring pattern, which are exposed from the solder resist layer 23, form second pads (not shown in the drawings) and are electrically connected to the external connection terminals 90, respectively.

The first wiring pattern and the second wiring pattern are electrically connected via a penetrating wiring (not shown in the drawings) that penetrates the insulating member 21 in a thickness direction. The first wiring pattern, the second wiring pattern and the penetrating wiring may be made of copper (Cu) or the like, for example. The thickness of each of the first wiring pattern and the second wiring pattern may be about 5 to 20 μm, respectively, for example. The diameter of the penetrating wiring may be a few ten micrometers, for example.

The semiconductor chip 40 is mounted on the wiring board 20. Specifically, the semiconductor chip 40 is mounted on a first surface of the solder resist layer 22 of the wiring board 20 via the adhesion layer 30 in a face-up state (facing a circuit forming surface upward).

The semiconductor chip 40 includes a semiconductor substrate (not shown in the drawings) whose main constituent is silicon or the like, for example, and a plurality of electrode pads 41 formed on the circuit forming surface of the semiconductor substrate at its peripheral. The electrode pads 41 of the semiconductor chip 40 are electrically connected to the first pads of the wiring board 20 via the metal wirings 50 (bonding wires) such as gold wirings, copper wirings or the like, respectively.

The semiconductor chip 40 may have a rectangular shape about 5 mm×5 mm, for example, in a plan view. The thickness of the semiconductor chip 40 may be, for example, a few ten micrometers to a few hundred micrometers. For the adhesion layer 30, for example, a die attach film or the like may be used. Alternatively, for the adhesion layer 30, for example, a paste adhesive agent or the like may be used.

The heat radiation plate 70 functions to release heat generated by the operation of the semiconductor chip 40 toward outside. The heat radiation plate 70 is attached to the circuit forming surface of the semiconductor chip 40 at an inner area of the electrode pads 41 via the adhesion layer 60, for example. For the adhesion layer 60, for example, a die attach film or the like may be used. Alternatively, for the adhesion layer 60, for example, a paste adhesive agent or the like may be used.

The heat radiation plate 70 includes an insulating member 71, a first metal foil 72 formed on a first surface of the insulating member 71, a second metal foil 73 formed on a second surface of the insulating member 71 and a metal layer 74 that penetrates the insulating member 71 in the thickness direction to thermally connect the first metal foil 72 and the second metal foil 73. Here, "thermally connect" means to form a heat radiation path. In other words, the metal layer 74 composes a heat radiation path that transmits heat from the first metal foil 72 to the second metal foil 73 (or from the second metal foil 73 to the first metal foil 72).

The first metal foil 72 and the second metal foil 73 are formed on the entirety of the first surface and the second surface of the insulating member 71, respectively. The metal layer 74 is a typical example of a "metal layer that thermally connects the first metal foil and the second metal foil by penetrating the insulating member in a thickness direction". The metal layer 74 is a typical example of a metal layer "formed to cover an inner surface of the through hole".

The first metal foil 72, the insulating member 71 and the second metal foil 73 are provided with a plurality of through holes 71x each of which penetrates the first metal foil 72, the insulating member 71 and the second metal foil 73 (penetrates the heat radiation plate 70 in the thickness direction). The metal layer 74 is formed to cover inner surfaces of the plurality of through holes 71x. In this embodiment, the metal layer 74 does not fill each of the through holes 71x and a cavity portion is formed inside the metal layer 74 in each of the through holes 71x. A part of the adhesion layer 60 is exposed within the cavity portion formed inside the metal layer 74 in each of the through holes 71x.

As the metal layer 74 formed in each of the through holes 71x forms the heat radiation path that radiates and releases the heat generated by the semiconductor chip 40 to the outside, it is preferable to densely form the through holes 71x (metal layers 74) among the entirety of the insulating member 71 to improve the radiation effect. However, the configuration of the through holes 71x (metal layers 74) is not specifically limited, and may be radially placed, placed like a grid, or randomly placed.

The through hole 71x may have a circular shape in a plan view, for example. At this time, the diameter of the through hole 71x may be, for example, about 0.1 to 0.15 mm. The pitch of the through holes 71x may be, for example, about 0.5 mm. Alternatively, the through hole 71x may have an elliptical shape, a rectangular shape or the like in a plan view. Although 16 through holes 71x are formed in the semiconductor package 10 shown in FIG. 1A and FIG. 1B, the number of the through holes 71x is not limited so, and a larger number of the through holes 71x may be formed.

For example, for the first metal foil 72 and the second metal foil 73, a copper foil or the like may be used. For example, for the metal layer 74, copper (Cu) or the like may be used. The thickness of each of the first metal foil 72, the second metal foil 73 and the metal layer 74 may be, for example, about 5 to 15 μm.

The insulating member 71 of the heat radiation plate 70 includes a material that is the same as a resin included in the wiring board 20 (a resin that is the main constituent of the insulating member 21) as a main constituent. For example, when the insulating member 21 of the wiring board 20 is a member in which epoxy resin is impregnated in a glass cloth, the insulating member 71 of the heat radiation plate 70 may be configured to include epoxy resin as a main constituent. Further, at this time, the insulating member 71 of the heat radiation plate 70 may include a member in which epoxy resin is impregnated in a glass cloth.

Here, the insulating member 71 of the heat radiation plate 70 may include the same resin as that included in the wiring board 20 (the resin that is the main constituent of the insulating member 21) as the main constituent. It is not necessary for the insulating member 71 of the heat radiation plate 70 to include the glass cloth. The thickness of the insulating member 71 may be, for example, about a few hundred micrometers.

In the heat radiation plate 70, a second surface of the second metal foil 73 and a lower end surface of the metal layer 74 are bonded to the circuit forming surface of the semiconductor chip 40 via the adhesion layer 60. As described above, the first metal foil 72 and the second metal foil 73 are formed on the entirety of the first surface and the second surface of the insulating member 71, respectively.

Thus, the area where the circuit forming surface of the semiconductor chip 40 and the second surface of the second metal foil 73 contact with each other via the adhesion layer 60 becomes larger to efficiently transmit the heat, generated by the operation of the semiconductor chip 40, to the metal layer 74 via the second metal foil 73. The heat generated by the operation of the semiconductor chip 40 is further transmitted from the metal layer 74 to the first metal foil 72. Then, the heat is efficiently eliminated to the outside from the first metal foil 72, which is formed on the entirety of the first surface of the insulating member 71.

The resin layer 80 is formed on the first surface of the solder resist layer 22 of the wiring board 20 to cover the adhesion layer 30, the semiconductor chip 40, the metal wirings 50, the adhesion layer 60 and the heat radiation plate 70. The resin layer 80 is formed to cover at least the side surfaces of the semiconductor chip 40 and the heat radiation plate 70 and expose the first surface of the first metal foil 72 of the heat radiation plate 70. The first surface of the resin layer 80 and the first surface of the first metal foil 72 are positioned at a same plane.

For the resin layer 80, for example, a so-called "mold resin" or the like in which fillers such as silica or the like are included in epoxy resin may be used. By providing the resin layer 80 as such, the semiconductor chip 40 can be protected from absorption of moisture or the like. By exposing the first surface of the first metal foil 72 from the resin layer 80, good heat radiation characteristics can be retained.

The external connection terminals 90 are formed on (not shown in the drawings) the second pads of the wiring board 20, respectively. The external connection terminals 90 function as terminals electrically connected to another wiring board, another semiconductor package or the like (not shown in the drawings). The external connection terminals 90 are, for example, solder balls. For the solder ball, for example, an alloy including Pb, an alloy of Sn and Cu, an alloy of Sn and Ag, an alloy of Sn, Ag and Cu, or the like may be used.

Although the external connection terminals 90 are formed in the embodiment, the external connection terminals 90 may not be formed at this timing. In other words, it is enough as long as the wiring board 20 is provided with the second pads, which are exposed from the solder resist layer 23, so that the external connection terminals 90 can be formed. Then, the external connection terminals 90 may be formed at a necessary timing (for example until a time when the semiconductor package 10 is connected to another wiring board, another semiconductor package or the like).

Figure 2A:
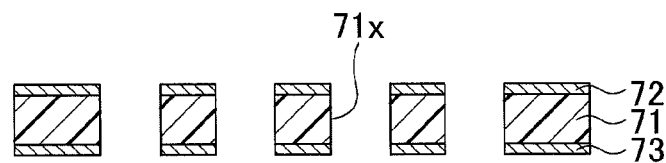
FIG. 2A to FIG. 2C are cross-sectional views showing an example of a method of manufacturing the semiconductor package of the first embodiment.
Figure 2B:
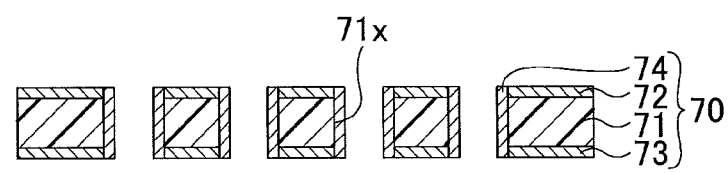
Figure 2C:
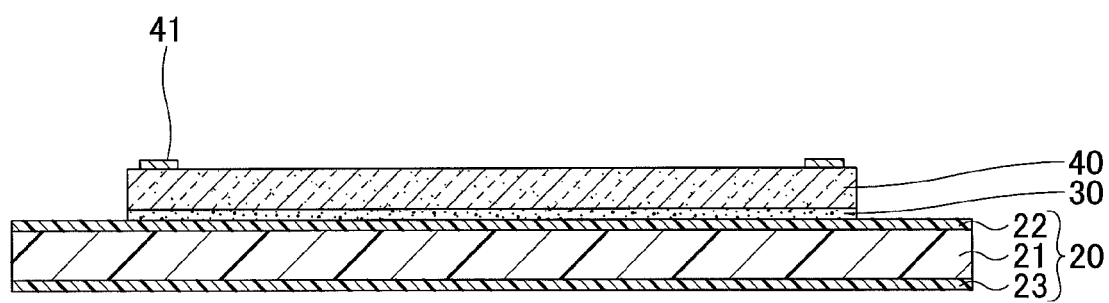

Next, a method of manufacturing the semiconductor package of the first embodiment (including a method of manufacturing the radiation plate) is explained. FIGS. 2A to 2C are cross-sectional views showing an example of a method of manufacturing the semiconductor package of the first embodiment.

First, the heat radiation plate 70 is manufactured (FIG. 2A and FIG. 2B). Specifically, with reference to FIG. 2A, the insulating member 71 provided, which has the first metal foil 72 at the first surface and the second metal foil 73 at the second surface. The insulating member 71 includes a material that is the same as the resin included in the wiring board 20 on which the semiconductor chip 40, to which the heat radiation plate 70 is attached, is mounted (the resin that is the main constituent of the insulating member 21) as a main constituent.

For example, when the insulating member 21 of the wiring board 20 is a member formed by impregnating epoxy resin in a glass cloth, the insulating member 71 of the heat radiation plate 70 is configured to include epoxy resin as the main constituent. Alternatively, the insulating member 71 of the heat radiation plate 70 may include a member in which epoxy resin is impregnated in a glass cloth. The thickness of the insulating member 71 may be, for example, about a few hundred micrometers. For the first metal foil 72 and the second metal foil 73, for example, a copper foil or the like may be used. The thickness of each of the first metal foil 72 and the second metal foil 73 may be, for example, about 5 to 15 μm.

Then, the plurality of through holes 71x, which penetrate the first metal foil 72, the insulating member 71 and the second metal foil 73 are formed. The through holes 71x may be, for example, formed by drilling, laser beam machining or the like. The configuration of the through holes 71x are not specifically limited, but may be radially placed, placed like a grid, or randomly placed.

The through hole 71x may have a circular shape in a plan view, for example. At this time, the diameter of the through hole 71x may be, for example, about 0.1 to 0.15 mm. The pitch of the through holes 71x may be, for example, about 0.5 mm. The through hole 71x may have an elliptical shape, a rectangular shape or the like in a plan view.

Here, as the through holes 71x are formed to penetrate the first metal foil 72 and the second metal foil 73, there may be a case where burrs are generated at end portions of the first metal foil 72 and the second metal foil 73 (in the vicinity of the outer peripheral of each of the through holes 71x). When the burrs are generated, it is preferable to remove the burrs by a wet etching process, a blast process or the like. If the burrs are left, a flow of plating solution is prevented when forming the metal layer 74 by plating in the later process. Here, the part of the through hole 71x at the first surface or the second surface in the vicinity of its peripheral portion may be exposed from the first metal foil 72 or the second metal foil 73, respectively, by removing the burrs.

Then, the metal layer 74 that thermally connects the first metal foil 72 and the second metal foil 73 via the through holes 71x is formed (FIG. 2B). In this embodiment, the metal layer 74 is formed not to fill each of the through holes 71x and to cover the inner surface of each of the through holes 71x. For the metal layer 74, for example, copper (Cu) or the like may be used. The thickness of the metal layer 74 may be, for example, about a few micrometers to a few ten micrometers. The metal layer 74 may be formed by, for example, electroless plating, electrolysis plating or the like.

With this, the heat radiation plate 70 is manufactured in which the first metal foil 72 is formed at the entirety of the first surface of the insulating member 71, the second metal foil 73 is formed at the entirety of the second surface of the insulating member 71, and the first metal foil 72 and the second metal foil 73 are thermally connected via the metal layer 74 formed in each of the through holes 71x.

Then, the wiring board 20 including the insulating member 21, the solder resist layer 22 and the solder resist layer 23 is prepared (FIG. 2C). For the insulating member 21, for example, a member in which epoxy resin is impregnated in a glass cloth may be used. The thickness of the insulating member 21 may be, for example, a few hundred micrometers.

The first wiring pattern and the solder resist layer 22 that selectively covers the first wiring pattern are formed at the first surface of the insulating member 21. The parts of the first wiring pattern, which are exposed from the solder resist layer 22, form the first pads and are electrically connected with the metal wirings 50, respectively.

The second wiring pattern and the solder resist layer 23 that selectively covers the second wiring pattern are formed at the second surface of the insulating member 21. The parts of the second wiring pattern, which are exposed from the solder resist layer 23 form the second pads and are electrically connected to the external connection terminals 90, respectively.

The first wiring pattern and the second wiring pattern are electrically connected with each other via the penetrating wiring that penetrates the insulating member 21 in the thickness direction. For the first wiring pattern, the second wiring pattern and the penetrating wiring, for example, copper (Cu) or the like may be used. The thickness of each of the first wiring pattern and the second wiring pattern may be, for example, about 5 to 15 μm. The diameter of the penetrating wiring may be, for example, about a few ten micrometers.

Then, the semiconductor chip 40 is prepared that includes the semiconductor substrate whose main constituent is silicon or the like, and the plurality of electrode pads 41 formed on the circuit forming surface of the semiconductor substrate. The semiconductor chip 40 may have a rectangular shape about 5 mm×5 mm, for example, in a plan view. The thickness of the semiconductor chip 40 may be, for example, about a few ten micrometers to a few hundred micrometers.

Thereafter, the semiconductor chip 40 is mounted on the first surface of the solder resist layer 22 of the wiring board 20 via the adhesion layer 30 in a face-up state (facing the circuit forming surface upward). For the adhesion layer 30, for example, a die attach film or the like may be used. Alternatively, for the adhesion layer 30, for example, a paste adhesive agent or the like may be used.

Figure 3A:
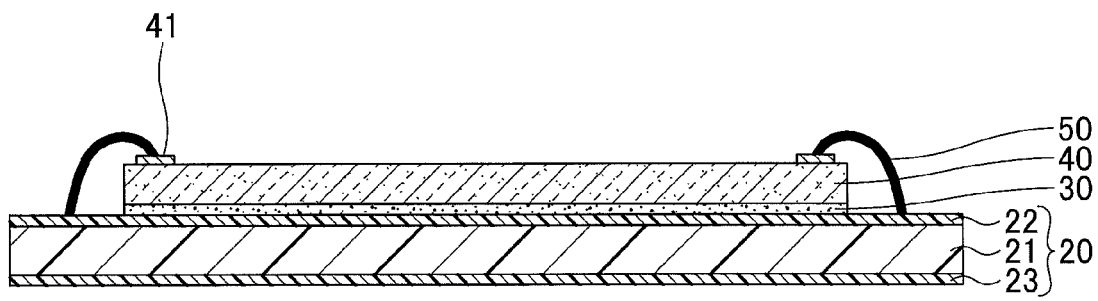
FIG. 3A to FIG. 3C are cross-sectional views showing an example of a method of manufacturing the semiconductor package of the first embodiment.

Then, the electrode pads 41 of the semiconductor chip 40 are electrically connected with the first pads of the wiring board 20 via the metal wirings 50 (bonding wires) such as gold wirings, copper wirings or the like, respectively (FIG. 3A). A wire bonding device may be used for the connection of the metal wirings 50 (bonding wires), for example. The processes shown in FIG. 2A and FIG. 2B and the processes shown in FIG. 2C and FIG. 3A may be performed in parallel as they are independent from each other.

Figure 3B:
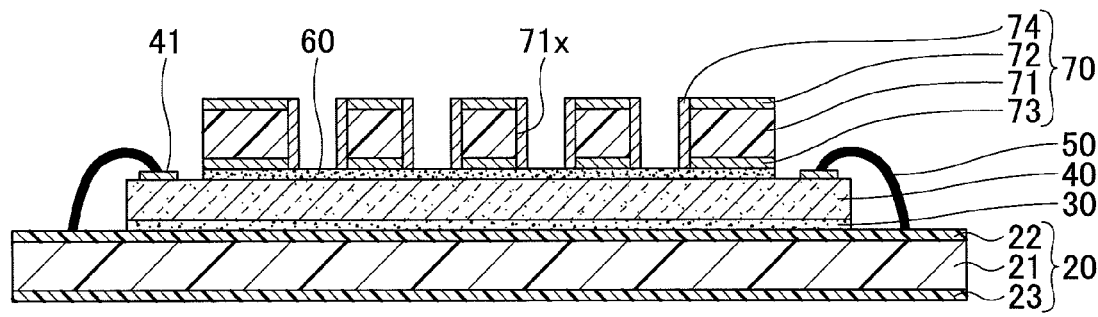

Subsequently, the heat radiation plate 70 is attached to the circuit forming surface of the semiconductor chip 40 at the inner area of the electrode pads 41 via the adhesion layer 60, for example (FIG. 3B). For the adhesion layer 60, for example, a die attach film or the like may be used. Alternatively, for the adhesion layer 60, for example, a paste adhesive agent or the like may be used. With this, in the heat radiation plate 70, the second surface of the second metal foil 73 and the lower end surface of the metal layer 74 contact the circuit forming surface of the semiconductor chip 40 via the adhesion layer 60.

Figure 3C:
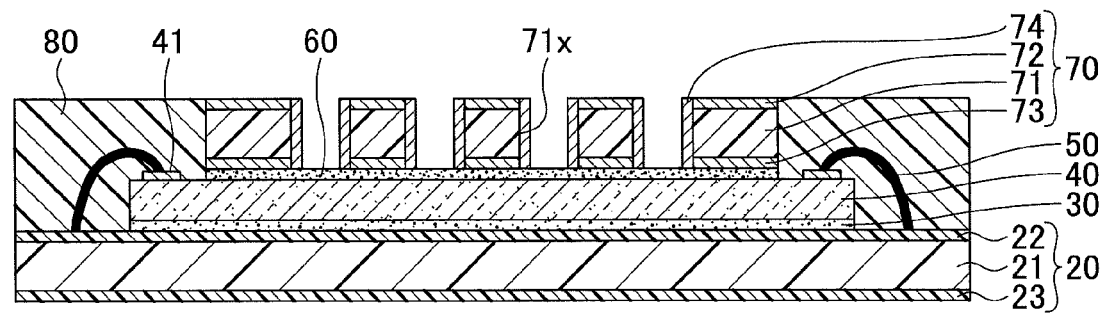

Then, the resin layer 80 is formed on the first surface of the solder resist layer 22 of the wiring board 20 to cover the adhesion layer 30, the semiconductor chip 40, the metal wirings 50, the adhesion layer 60 and the heat radiation plate 70 (FIG. 3C). Here, the first surface of the first metal foil 72 of the heat radiation plate 70 is exposed from the resin layer 80. For the resin layer 80, for example, a so-called mold resin or the like in which fillers such as silica or the like are included in epoxy resin may be used.

The resin layer 80 may be formed by, for example, transfer molding, compression molding or the like. Here, before forming the resin layer 80, a surface roughing process by plasma or the like may be performed on the first surface of the solder resist layer 22. With this operation, the adhesion property between the first surface of the solder resist layer 22 and the resin layer 80 can be improved by an anchor effect.

Thereafter, after the process shown in FIG. 3C, the external connection terminals 90 are formed on the second pads (not shown in the drawings) of the wiring board 20, respectively. The external connection terminals 90 function as terminals electrically connected to another wiring board, another semiconductor package or the like (not shown in the drawings). The external connection terminals 90 are, for example, solder balls. For the solder ball, for example, an alloy including Pb, an alloy of Sn and Cu, an alloy of Sn and Ag, an alloy of Sn, Ag and Cu or the like may be used.

Although the external connection terminals 90 are formed in the embodiment, the external connection terminals 90 may not be formed at this timing. In other words, it is enough as long as the wiring board 20 is provided with the second pads, which are exposed from the solder resist layer 23, so that the external connection terminals 90 can be formed. Then, the external connection terminals 90 may be formed at a necessary timing (for example until a time when the semiconductor package 10 is connected to another wiring board, another semiconductor package or the like).

With the above processes, the semiconductor package 10 as shown in FIG. 1A and FIG. 1B is formed. Here, the example where the semiconductor chip 40 or the heat radiation plate 70 are individually manufactured, and the semiconductor chip 40 and the heat radiation plate 70 are mounted on the individual wiring board 20 is explained with reference to FIG. 2A to FIG. 3C. However, alternatively, the semiconductor chip 40 may be formed as follows. A larger semiconductor substrate including a plurality of areas to be semiconductor chips 40, respectively, is prepared. Then, a plurality of the semiconductor chips 40 are formed on the larger semiconductor substrate. The larger semiconductor substrate is divided by dicing or the like to obtain the plurality of semiconductor chips 40.

Similarly, the wiring board 20 or the heat radiation plate 70 may be obtained by manufacturing a larger component including a plurality of the wiring boards 20 or the heat radiation plates 70, respectively. Then, the larger component is divided by dicing or the like to obtain the plurality of the wiring boards 20 or the heat radiation plates 70, respectively. According to the embodiment, the insulating member 71 that composes the heat radiation plate 70 includes a resin as a main constituent. Thus, it is easier to divide the insulating member 71 by dicing or the like compared with a case for a radiation plate that is composed of only ceramic or metal. Here, for the radiation plate composed of only ceramic or metal, a die or a pressing machine is necessary to cut. Thus, it needs more time compared with dicing.

By dicing, the insulating member 71 is exposed at side surfaces, which is an outer peripheral of the heat radiation plate 70. Then, the resin layer 80 seals at least a part of the heat radiation plate 70. As the resin layer 80 contacts the insulating member 71 (resin material) exposed from the side surfaces of the outer peripheral of the heat radiation plate 70 (it means the resin materials contact with each other), the resin layer 80 and the heat radiation plate 70 have a good adhesion property.

By using a material that is the same as the resin included in the wiring board 20 for the insulating member 71 composing the heat radiation plate 70 as the main constituent, the coefficients of thermal expansion and the coefficients of elasticity of the heat radiation plate 70 and the wiring board 20 become similar to each other, respectively. Further, the heat radiation plate 70 and the wiring board 20 are positioned at the upper and the lower sides of the semiconductor chip 40 while interposing the semiconductor chip 40 therebetween. Thus, the physical properties (the coefficients of thermal expansion or the coefficients of elasticity) of both are balanced to reduce warping of the semiconductor package 10.

The heat radiation plate 70 includes the first metal foil 72 that is formed on the entirety of the first surface of the insulating member 71, the second metal foil 73 that is formed on the entirety of the second surface of the insulating member 71, and the metal layer 74 that penetrates the insulating member 71 in the thickness direction to thermally connect the first metal foil 72 and the second metal foil 73. Further, in the heat radiation plate 70, the second surface of the second metal foil 73 and the lower end surface of the metal layer 74 are bonded to the circuit forming surface of the semiconductor chip 40 via the adhesion layer 60. Thus, the area where the circuit forming surface of the semiconductor chip 40 and the second surface of the second metal foil 73 contact with each other via the adhesion layer 60 becomes larger to efficiently transmit the heat generated by the operation of the semiconductor chip 40 to the metal layer 74 via the second metal foil 73. The heat generated by the operation of the semiconductor chip 40 is further transmitted from the metal layer 74 to the first metal foil 72. Then, the heat is efficiently eliminated to the outside from the first metal foil 72, which is formed on the entirety of the first surface of the insulating member 71. As such, the metal layer 74 formed in each of the through holes 71x functions as the heat radiation path that radiates the heat generated by the semiconductor chip 40 to the outside and the radiation efficiency can be improved.

Alternative Example of the First Embodiment

In an alternative example 1 of the first embodiment, an example is described in which the radiation plate is covered by the resin layer. The same components explained in the above embodiment are given the same reference numerals, and explanations are not repeated.

Figure 4A:
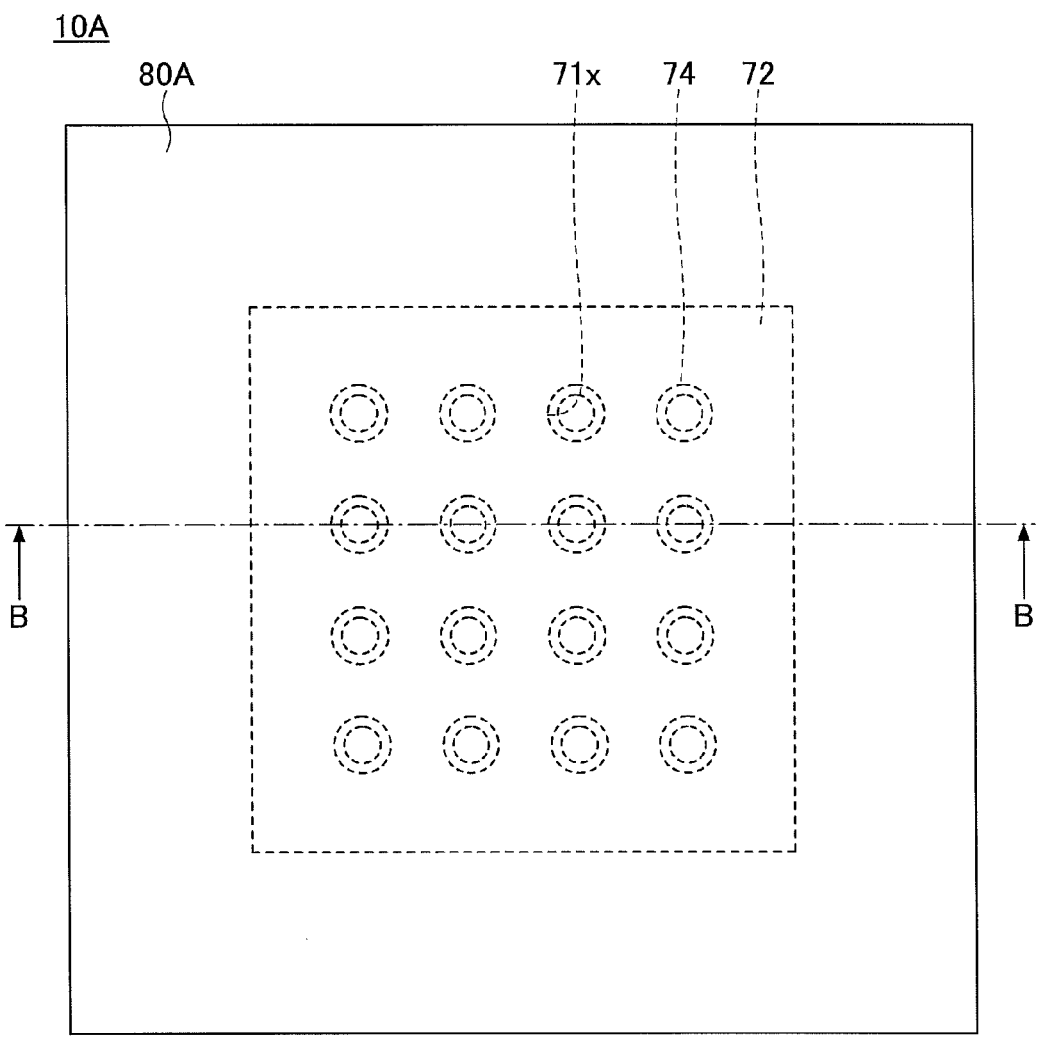
FIG. 4A is a plan view showing an alternative example of the semiconductor package of the first embodiment.
Figure 4B:
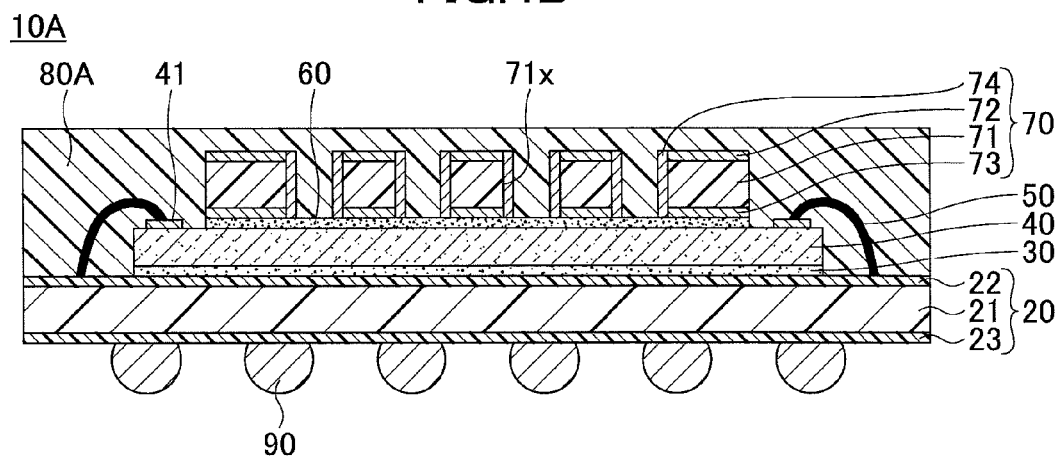
FIG. 4B is a cross-sectional view showing an example of the semiconductor package of the first embodiment taken along a B-B line in FIG. 4A.

FIG. 4A and FIG. 4B show an example of a semiconductor package 10A of the alternative example 1 of the first embodiment. FIG. 4A is a plan view and FIG. 4B is a cross-sectional view taken along a B-B line in FIG. 4A.

With reference to FIG. 4A and FIG. 4B, the semiconductor package 10A of the alternative example 1 of the first embodiment is different from that described in the semiconductor package 10 of the first embodiment (see FIG. 1A and FIG. 1B) in that the radiation plate 70 is covered by a resin layer 80A.

In other words, for the semiconductor package 10 (see FIG. 1A and FIG. 1B), the first surface of the first metal foil 72 of the heat radiation plate 70 is exposed from the resin layer 80. However, for the semiconductor package 10A, the first surface of the first metal foil 72 of the heat radiation plate 70 is covered by the resin layer 80A. Further, for the semiconductor package 10, the inner side portion of the metal layer 74 in each of the through holes 71x is the cavity portion, while for the semiconductor package 10A, the inner side portion of the metal layer 74 in each of the through holes 71x is filled with the resin layer 80A. The material and the method of manufacturing the resin layer 80A are the same as those for the resin layer 80, for example.

As such, even when the first surface of the first metal foil 72 of the heat radiation plate 70 is covered by the resin layer 80A, the same advantage as that of the first embodiment can be obtained.

As the inner side portion of the metal layer 74 in each of the through holes 71x is filled with the resin layer 80A, the absorption of moisture for the semiconductor chip 40 via the cavity portion of the respective through hole 71x can be prevented to improve the reliability of the semiconductor chip 40. As the first surface of the first metal foil 72 is covered by the resin layer 80A, the corrosion of the first surface of the first metal foil 72 can be prevented to improve the reliability of the heat radiation plate 70.

Here, however, as the first surface of the first metal foil 72 of the heat radiation plate 70 is covered by the resin layer 80A, the heat radiation characteristics of the semiconductor package 10A becomes worse than the heat radiation characteristics of the semiconductor package 10 in which the first surface of the first metal foil 72 of the heat radiation plate 70 is exposed from the resin layer 80. Thus, the semiconductor package 10 of the first embodiment or the semiconductor package 10A of the alternative example 1 may be selected based on the specification of the product (whether the priority is given to the heat radiation characteristics, the resistance against the absorption of moisture or the resistance against the corrosion).

Second Embodiment

In the second embodiment, the semiconductor chip is mounted on the first surface of the wiring board by a flip chip bonding. The same components explained in the above embodiment are given the same reference numerals, and explanations are not repeated.

Figure 5:
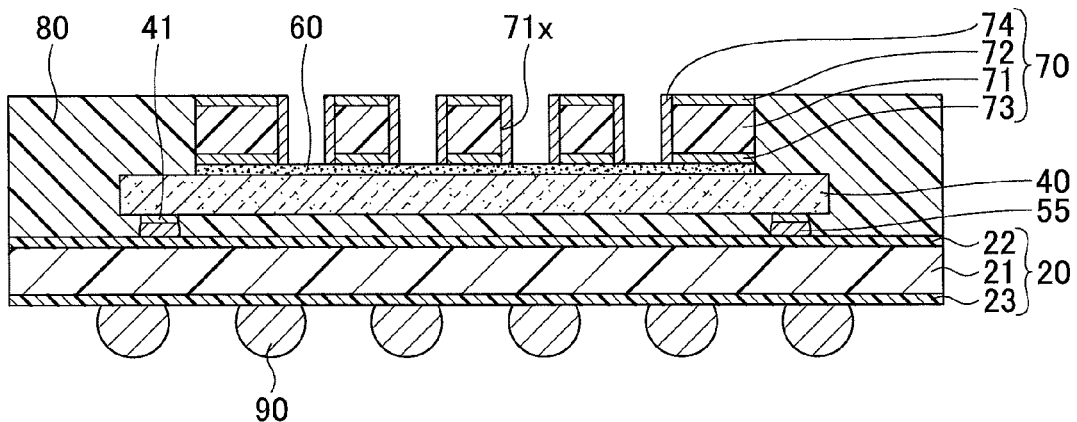
FIG. 5 is a cross-sectional view showing an example of the semiconductor package of a second embodiment.
Figure 6:
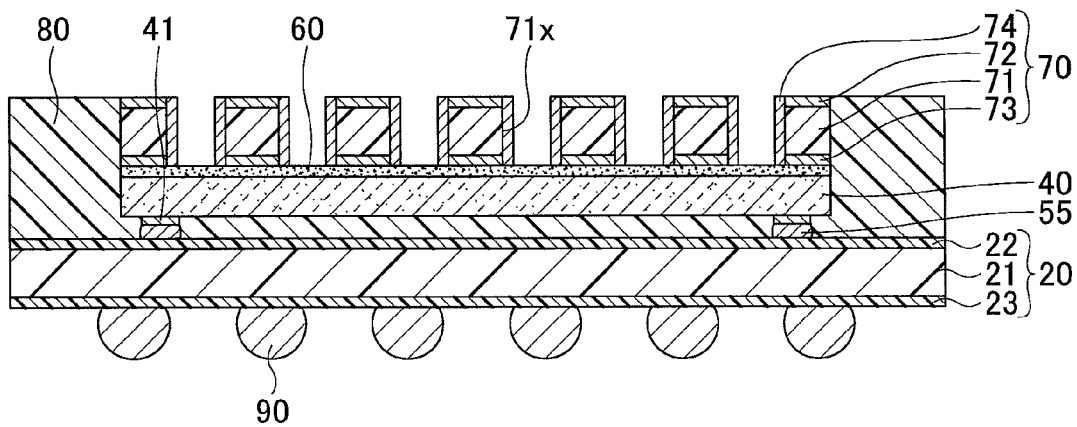
FIG. 6 is a cross-sectional view showing another example of the semiconductor package of the second embodiment.
Figure 7:
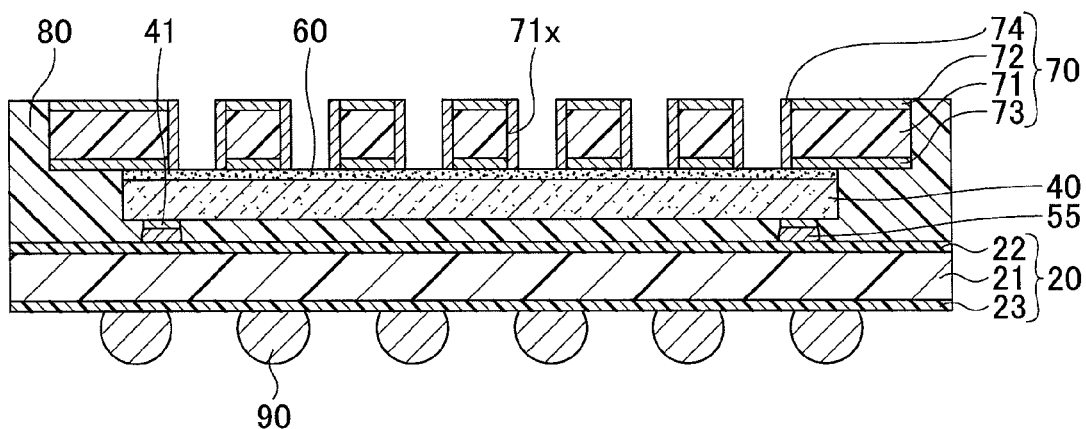
FIG. 7 is a cross-sectional view showing another example of the semiconductor package of the second embodiment.

FIG. 5 to FIG. 7 are cross-sectional views showing an example of the semiconductor package of the second embodiment, respectively. FIG. 6 and FIG. 7 show alternative examples in each of which the shape of the heat radiation plate 70 in a plan view is changed (enlarged) from that shown in FIG. 5. The semiconductor package of the second embodiment has a similar shape as shown in FIG. 1A in a plan view. FIG. 5 to FIG. 7 correspond to a cross-sectional view taken along the A-A line in FIG. 1A.

With reference to FIG. 5, a semiconductor package 100A of the second embodiment is different from the semiconductor package 10 of the first embodiment (see FIG. 1A and FIG. 1B) in that the semiconductor chip 40 is mounted on the first surface of the wiring board 20 by the flip chip bonding.

In the semiconductor package 10, the semiconductor chip 40 is mounted on the first surface of the solder resist layer 22 of the wiring board 20 via the adhesion layer 30 in a face-up state (facing the circuit forming surface upward). On the other hand, in the semiconductor package 100A, the semiconductor chip 40 is mounted on the first surface of the solder resist layer 22 of the wiring board 20 in a face-down state (facing the circuit forming surface downward).

In the semiconductor package 100A, the electrode pads 41 of the semiconductor chip 40 are electrically connected with the first pads of the wiring board 20 facing the electrode pads 41 via internal connection terminals 55, respectively. The internal connection terminals 55 may be, for example, solder balls. For the solder ball, for example, an alloy including Pb, an alloy of Sn and Cu, an alloy of Sn and Ag, an alloy of Sn, Ag and Cu, or the like may be used.

The heat radiation plate 70 is attached to a back surface (a surface opposite to the circuit forming surface) of the semiconductor chip 40 via the adhesion layer 60. In the heat radiation plate 70, the second surface of the second metal foil 73 and the lower end surface of the metal layer 74 contact the back surface of the semiconductor chip 40 via the adhesion layer 60. Thus, the heat generated by the operation of the semiconductor chip 40 is transmitted to the first metal foil 72 via the second metal foil 73 and the metal layer 74 to be radiated from the first metal foil 72 to the outside.

As such, when the semiconductor chip 40 is mounted on the first surface of the wiring board 20 by the flip chip bonding, the same advantage as the first embodiment can be obtained.

The heat radiation plate 70 is mounted on the back surface of the semiconductor chip 40 (the surface opposite to the circuit forming surface) via the adhesion layer 60. Here, the back surface of the semiconductor chip 40 is a flat surface on which the electrode pads or the like are not generated. Thus, as a semiconductor package 100B shown in FIG. 6, the shape of the heat radiation plate 70 may be formed to be substantially the same as that of the semiconductor chip 40 in a plan view. Then, the heat radiation plate 70 may be attached to the back surface of the semiconductor chip 40 such that the heat radiation plate 70 and the semiconductor chip 40 overlap with each other. Alternatively, similar to a semiconductor package 100C shown in FIG. 7, the size of the heat radiation plate 70 may be made larger than that of the semiconductor chip 40 in a plan view. Then, the heat radiation plate 70 may be attached to the back surface of the semiconductor chip 40 such that the heat radiation plate 70 protrudes from the semiconductor chip 40 in a plan view. With this, as the entirety of the back surface of the semiconductor chip 40 contacts the heat radiation plate 70 via the adhesion layer 60, the heat radiation characteristics can be further improved.

Alternative Example of the Second Embodiment

In the alternative example 1 of the second embodiment, an example is disclosed in which the semiconductor chip is mounted on the first surface of the wiring board by the flip chip bonding and the radiation plate is covered by the resin layer. The same components explained in the above embodiments are given the same reference numerals, and explanations are not repeated.

Figure 8:
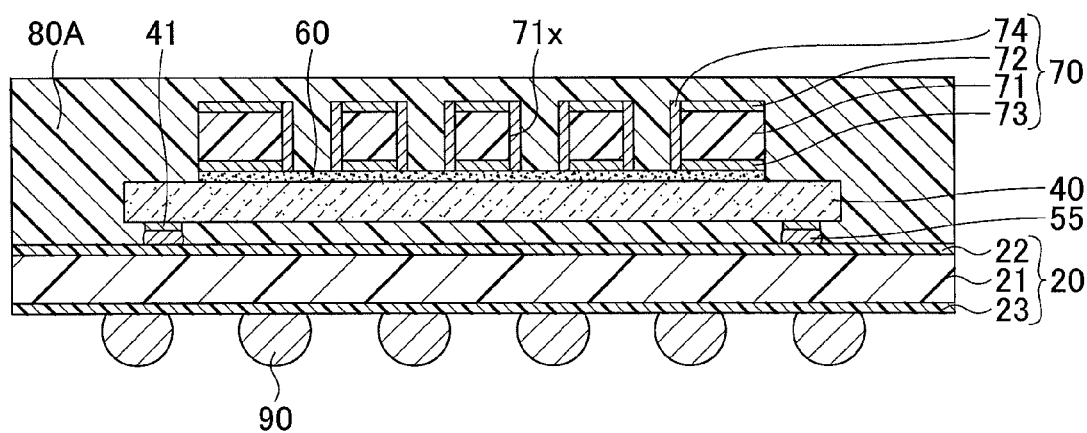
FIG. 8 is a cross-sectional view showing another example of the semiconductor package of the second embodiment.

FIG. 8 is a cross-sectional view showing an example of the semiconductor package of the alternative example 1 of the second embodiment. The semiconductor package of the alternative example 1 of the second embodiment has the same structure in a plan view as that shown in FIG. 4A, and FIG. 8 corresponds to a cross-sectional view taken along the B-B line in FIG. 4A.

With reference to FIG. 8, a semiconductor package 100D of the alternative example 1 of the second embodiment is different from the semiconductor package 100A of the second embodiment (see FIG. 5) in that the heat radiation plate 70 is covered by the resin layer 80A.

In other words, although the first surface of the first metal foil 72 of the heat radiation plate 70 is exposed from the resin layer 80 in the semiconductor package 100A, for the semiconductor package 100D, the first surface of the first metal foil 72 of the heat radiation plate 70 is covered by the resin layer 80A. Further, although for the semiconductor package 100A, the cavity portion is formed at the inner side portion of the metal layer 74 in each of the through holes 71x, for the semiconductor package 100D, the inner side portion of the metal layer 74 of each of the through holes 71x is filled with the resin layer 80A. The material and the method of manufacturing the resin layer 80A may be the same as those of the resin layer 80, for example.

As such, even when the first surface of the first metal foil 72 of the heat radiation plate 70 is covered by the resin layer 80A, the same advantage as that of the first embodiment can be obtained.

As the inner side portion of the metal layer 74 of each of the through holes 71x is filled with the resin layer 80A, the absorption of moisture for the semiconductor chip 40 via the cavity portion of the respective through hole 71x can be prevented to improve the reliability of the semiconductor chip 40. Further, as the first surface of the first metal foil 72 is covered by the resin layer 80A, the corrosion of the first surface of the first metal foil 72 can be prevented to improve the reliability of the heat radiation plate 70.

Here, however, as the first surface of the first metal foil 72 of the heat radiation plate 70 is covered by the resin layer 80A, the heat radiation characteristics of the semiconductor package 100D becomes worse than the heat radiation characteristics of the semiconductor package 100A in which the first surface of the first metal foil 72 of the heat radiation plate 70 is exposed from the resin layer 80. Thus, the semiconductor package 100A of the second embodiment or the semiconductor package 100D of the alternative example 1 may be selected based on the specification of the product (whether the priority is given to the heat radiation characteristics, the resistance against the absorption of moisture or the resistance against the corrosion).

Further, for the alternative example 1 of the second embodiment, similar to the semiconductor packages 100A to 100C of the second embodiment, the shape of the heat radiation plate 70 in a plan view may be arbitrarily designed.

Alternative Examples of the Radiation Plate

Alternative examples of the radiation plate of the embodiment are explained. The same components explained in the above embodiment are given the same reference numerals, and explanations are not repeated.

FIG. 9A to FIG. 9D are cross-sectional views showing alternative examples of the radiation plate of the embodiment. FIG. 9A to FIG. 9D show heat radiation plates 70A to 70D of different structures, respectively. Any of the heat radiation plates 70A to 70D may be substituted by the heat radiation plate 70 of the first embodiment, the second embodiment, and each of the alternative examples.

Figure 9A:
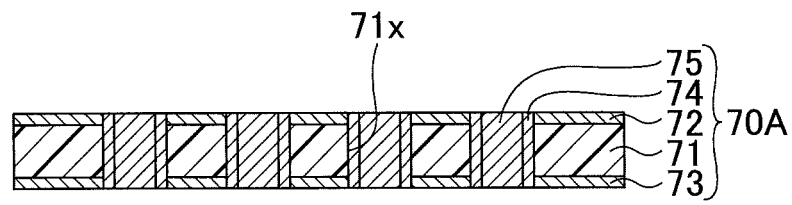
FIG. 9A to FIG. 9D are cross-sectional views showing alternative examples of a radiation plate of the embodiment.

In the heat radiation plate 70A shown in FIG. 9A, the inner side portion of the metal layer 74 of each of the through holes 71x is filled with a metal layer 75. For the metal layer 75, for example, copper (Cu) or the like may be used. The metal layer 75 may be made of, for example, electroless plating, electrolysis plating or the like.

Here, the metal layers 74 and 75 are a typical example of a "metal layer that thermally connects the first metal foil and the second metal foil by penetrating the insulating member in a thickness direction". The metal layers 74 and 75 are a typical example of a metal layer "that is formed to fill the through hole".

As such, for the heat radiation plate 70A, the inner side portion of the metal layer 74 in each of the through holes 71x is filled with the metal layer 75. Thus, when attaching the heat radiation plate 70A on the semiconductor chip 40, the heat generated by the operation of the semiconductor chip 40 can be effectively transmitted to the first metal foil 72 via the metal layers 74 and 75 to be discharged from the first metal foil 72 to outside.

According to the example, when the heat radiation plate 70A is attached, the absorption of moisture for the semiconductor chip 40 via the cavity portion of the respective through hole 71x can be prevented to improve the reliability of the semiconductor chip 40. According to the example, similar to the first embodiment, by exposing the first surface of the first metal foil 72 of the heat radiation plate 70 from the resin layer 80, the resistance against the absorption of moisture of the semiconductor chip 40 can be improved without sacrificing the heat radiation characteristics.

Figure 9B:
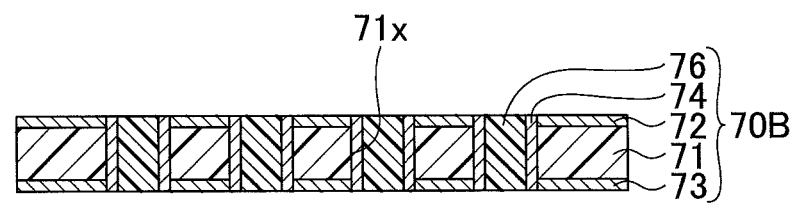

In the heat radiation plate 70B shown in FIG. 9B, the inner side portion of the metal layer 74 in each of the through holes 71x is filled with an insulating layer 76. The insulating layer 76 may be formed by, for example, coating and curing liquid epoxy photosensitive resin compositions or the like in the inner side portion of the metal layer 74 in each of the through holes 71x.

As such, in the heat radiation plate 70B, the inner side portion of the metal layer 74 in each of the through holes 71x is filled with the insulating layer 76. Thus, when the heat radiation plate 70B is attached on the semiconductor chip 40, the absorption of moisture for the semiconductor chip 40 via the cavity portion of the respective through hole 71x can be prevented to improve the reliability of the semiconductor chip 40. According to the example, similar to the first embodiment, by exposing the first surface of the first metal foil 72 of the heat radiation plate 70 from the resin layer 80, the resistance against the absorption of moisture of the semiconductor chip 40 can be improved without sacrificing the heat radiation characteristics.

Figure 9C:
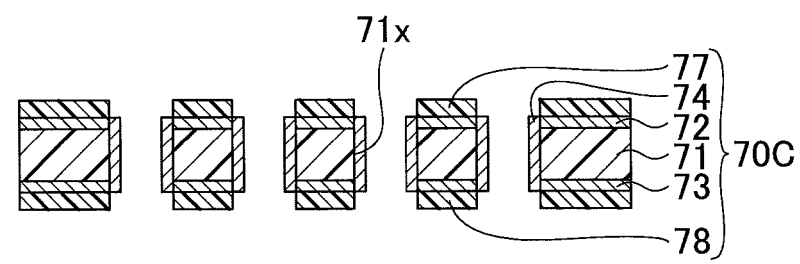

In the heat radiation plate 70C shown in FIG. 9C, insulating layers 77 and 78 are respectively formed on the first surface of the first metal foil 72 and the second surface of the second metal foil 73, respectively. The insulating layers 77 and 78 may be formed by, for example, coating liquid epoxy photosensitive resin compositions or the like on the first surface of the first metal foil 72 and the second surface of the second metal foil 73, respectively, and removing parts of the liquid epoxy photosensitive resin compositions or the like at the through holes 71x and the peripherals thereof by an exposure and development. It means that the insulating layers 77 and 78 are not formed on the metal layer 74 so that the metal layer 74 is exposed.

The insulating layer 77 may be extended to cover an end surface (at upper surface) of the metal layer 74. The insulating layer 78 may be extended to cover an end surface (at lower surface) of the metal layer 74.

As such, in the heat radiation plate 70C, as the insulating layers 77 and 78 are respectively formed on the first surface of the first metal foil 72 and the second surface of the second metal foil 73, the corrosion of the first surface of the first metal foil 72 and the second surface of the second metal foil 73 can be prevented to improve the reliability of the heat radiation plate 70C.

However, in view of retaining good heat radiation characteristics, the insulating layer 78 may not be formed on the second surface of the second metal foil 73.

Figure 9D:
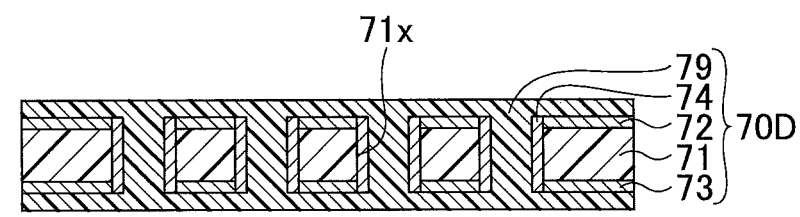

In the heat radiation plate 70D shown in FIG. 9D, an insulating layer 79 is formed on the first surface of the first metal foil 72 and the second surface of the second metal foil 73, and further, the inner side portion of the metal layer 74 in each of the through holes 71x is filled with the insulating layer 79. The insulating layer 79 may be formed by, for example, coating and curing liquid epoxy photosensitive resin compositions or the like at the first surface of the first metal foil 72 and the second surface of the second metal foil 73 as well as filling the inner side portion of the metal layer 74 in each of the through holes 71x.

As such, in the heat radiation plate 70D, the inner side portion of the metal layer 74 in each of the through holes 71x is filled with the insulating layer 79. Thus, when the heat radiation plate 70D is attached to the semiconductor chip 40, the absorption of moisture for the semiconductor chip 40 via the cavity portion of the respective through hole 71x can be prevented to improve the reliability of the semiconductor chip 40. As the insulating layer 79 is formed on the first surface of the first metal foil 72 and the second surface of the second metal foil 73, the corrosion of the first surface of the first metal foil 72 and the second surface of the second metal foil 73 can be prevented to improve the reliability of the heat radiation plate 70D.

However, in view of retaining good heat radiation characteristics, the insulating layer 79 may not be formed on the second surface of the second metal foil 73.

Although a preferred embodiment of the semiconductor package and the radiation plate has been specifically illustrated and described, it is to be understood that minor modifications may be made therein without departing from the spirit and scope of the invention as defined by the claims.

The present invention is not limited to the specifically disclosed embodiments, and numerous variations and modifications and modifications may be made without departing from the spirit and scope of the present invention.

For example, for the wiring board 20, a multi-layered wiring board in which a plurality of the insulating layers and a plurality of wiring layers are alternately stacked with each other, may be used. At this time, the heat radiation plate 70 or the like may include the resin same as that composes each of the insulating layers of the multi-layered wiring board as the main constituent.

In the heat radiation plate 70 shown in FIG. 1B or the heat radiation plate 70A shown in FIG. 9A, a surface treatment may be performed for exposed surfaces of the first metal foil 72, the second metal foil 73, the metal layer 74 and the metal layer 75 for preventing the corrosion. An example of the surface treatment may be, plating (with solder, tin or the like), an Organic Solderability Preservative (OSP) process or the like.

In the heat radiation plate 70A shown in FIG. 9A, an insulating layer may be formed at exposed surfaces of the first metal foil 72, the second metal foil 73, the metal layer 74 and the metal layer 75.

The heat radiation plate 70 or the like may be directly mounted on the circuit forming surface or the back surface of the semiconductor chip 40 without interposing the adhesion layer 60, and the heat radiation plate 70 or the like may be attached to the semiconductor chip 40 by coating an adhesive agent around (at the lower side at the side surface) the heat radiation plate 70 or the like in a frame shape. At this time, as the second metal foil 73 is directly bonded to the semiconductor chip 40 (the second metal foil 73 directly contacts the circuit forming surface or the back surface of the semiconductor chip 40), the heat radiation characteristics can be further improved.

According to the embodiments, a radiation plate having a good adhesion property with a resin layer, a method of manufacturing the radiation plate, and a semiconductor package in which the radiation plate is attached to a semiconductor chip can be provided.

Further, following embodiments are also included.

A radiation plate that is to be attached to a semiconductor chip mounted on a wiring board, including: an insulating member including a resin that is the same as a resin included in the wiring board, as a main constituent; a first metal foil formed on a first surface of the insulating member; a second metal foil formed on a second surface of the insulating member, the second surface being an opposite to the first surface, the radiation plate being provided with a through hole that penetrates the first metal foil, the insulating member and the second metal foil; and a metal layer formed to cover the inner surface of the through hole to thermally connect the first metal foil and the second metal foil by penetrating the insulating member in a thickness direction.

A method of manufacturing a radiation plate that is to be attached to a semiconductor chip mounted on a wiring board, the method including: forming a through hole that penetrates a first metal foil, an insulating member and a second metal foil, the first metal foil and the second metal foil being formed on a first surface and a second surface of the insulating member, respectively, the second surface being an opposite to the first surface, the insulating member including a resin that is the same as a resin included in the wiring board, as a main constituent; and forming a metal layer to cover the inner surface of the through hole to thermally connect the first metal foil and the second metal foil via the through hole.

What is claimed is:

1. A semiconductor package comprising:
a wiring board;
a semiconductor chip mounted on the wiring board;
an adhesion layer formed on the semiconductor chip; and
a radiation plate mounted on the semiconductor chip via the adhesion layer, including
an insulating plate including a resin that is the same as a resin included in the wiring board, as a main constituent,
a first metal foil formed on the entirety of a first surface of the insulating plate,
a second metal foil formed on the entirety of a second surface of the insulating plate, the second surface being opposite to the first surface,
the radiation plate being provided with a through hole that penetrates the first metal foil, the insulating plate and the second metal foil, and
a metal layer formed to cover the inner surface of the through hole to thermally connect the first metal foil and the second metal foil by penetrating the first metal foil, the insulating plate and the second metal foil in a thickness direction such as to cover side surfaces of the first metal foil, the insulating plate and the second metal foil in the through hole, the metal layer being formed not to fill the through hole so that a cavity portion is formed in the through hole and the adhesion layer is exposed at a bottom of the through hole.

2. The semiconductor package according to claim 1, further comprising:
a resin layer that seals a surface of the wiring board at which the semiconductor chip is mounted, and side surfaces of the semiconductor chip and the radiation plate, and
wherein the first metal foil is exposed from the resin layer.

3. The semiconductor package according to claim 1, wherein the metal layer is formed to fill the through hole.

4. The semiconductor package according to claim 1, wherein the inner side portion of the metal layer in the through hole is filled with an insulating layer.

5. The semiconductor package according to claim 4, wherein
the first metal foil and the second metal foil are covered with an insulating layer.

6. The semiconductor package according to claim 1, further comprising:
a first insulating layer and a second insulating layer formed to cover a surface of the first metal foil which is opposite to a surface that contacts the insulating member and a surface of the second metal foil which is opposite to a surface that contacts the insulating member, respectively,
wherein the first insulating layer and the second insulating layer are not formed on the metal layer so that the metal layer is exposed.

7. A semiconductor package comprising:
a wiring board;
a semiconductor chip mounted on the wiring board;
a radiation plate mounted on the semiconductor chip, including
an insulating plate including a resin that is the same as a resin included in the wiring board, as a main constituent,
a first metal foil formed on a first surface of the insulating plate,
a second metal foil formed on a second surface of the insulating plate,
the second surface being opposite to the first surface,
the radiation plate being provided with a through hole that penetrates the first metal foil, the insulating plate and the second metal foil, and
a metal layer formed to cover the inner surface of the through hole to thermally connect the first metal foil and the second metal foil by penetrating the first metal foil, the insulating plate and the second metal foil in a thickness direction such as to cover side surfaces of the first metal foil, the insulating plate and the second metal foil in the through hole; and a resin layer that seals a surface of the wiring board at which the semiconductor chip is mounted, and side surfaces of the semiconductor chip and the radiation plate, the resin layer being formed separately from the insulating plate, wherein the second metal foil is bonded to the semiconductor chip directly or via an adhesion layer and wherein the first metal foil is exposed from the resin layer.

\* \* \* \* \*